(12) United States Patent
Matsuda

(10) Patent No.: US 10,840,091 B2
(45) Date of Patent: Nov. 17, 2020

(54) PROCESS OF FORMING EPITAXIAL SUBSTRATE AND SEMICONDUCTOR DEVICE PROVIDED ON THE SAME

(71) Applicant: SUMITOMO ELECTRIC DEVICE INNOVATIONS, INC., Yokohama (JP)

(72) Inventor: Hajime Matsuda, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/847,171

(22) Filed: Dec. 19, 2017

(65) Prior Publication Data

US 2018/0174824 A1 Jun. 21, 2018

(30) Foreign Application Priority Data

Dec. 20, 2016 (JP) .................. 2016-246993

(51) Int. Cl.
*H01L 21/02* (2006.01)
*H01L 29/66* (2006.01)
(Continued)

(52) U.S. Cl.
CPC ...... *H01L 21/0254* (2013.01); *H01L 21/0262* (2013.01); *H01L 21/02458* (2013.01);
(Continued)

(58) Field of Classification Search
CPC ..... H01L 21/02–02458; H01L 21/0254; H01L 21/02548; H01L 21/0262; H01L 33/32;
(Continued)

(56) References Cited

U.S. PATENT DOCUMENTS

| 2002/0054616 A1 | 5/2002 | Kamiyama et al. |
| 2006/0191474 A1* | 8/2006 | Chen ............... B82Y 20/00 |
| | | 117/104 |
| 2008/0197359 A1* | 8/2008 | Imanishi ........... H01L 21/02378 |
| | | 257/76 |
| 2008/0308836 A1 | 12/2008 | Nakahara et al. |

(Continued)

FOREIGN PATENT DOCUMENTS

| JP | 2000-031588 | 1/2000 |
| JP | 2005-032823 | 2/2005 |

(Continued)

OTHER PUBLICATIONS

U.S. Appl. No. 15/820,596, filed Nov. 22, 2017.

*Primary Examiner* — Patricia D Reddington
(74) *Attorney, Agent, or Firm* — Smith, Gambrell & Russell, LLP.

(57) ABSTRACT

A process of forming a nucleus fanning layer in a nitride semiconductor epitaxial substrate is disclosed. The process includes steps of growing: a lower layer of the nucleus forming layer on a substrate; an upper layer of the nucleus thrilling layer on the lower layer; and a nitride semiconductor layer each by the metal organic chemical vapor deposition (MOCVD) technique. The growth of the nitride semiconductor layer is done at a temperature lower than a growth temperature for the upper layer, and the growth of the upper layer is done by supplying ammonia ($NH_3$) at a flow rate greater than the flow rate of ammonia ($NH_3$) timing the growth of the lower layer.

8 Claims, 4 Drawing Sheets

(51) Int. Cl.
*H01L 29/205* (2006.01)
*H01L 29/778* (2006.01)
*H01L 29/20* (2006.01)
*H01L 29/47* (2006.01)
*H01L 29/45* (2006.01)
*H01L 33/32* (2010.01)
*H01L 33/00* (2010.01)

(52) U.S. Cl.
CPC ...... *H01L 21/02502* (2013.01); *H01L 29/205* (2013.01); *H01L 29/66462* (2013.01); *H01L 29/7786* (2013.01); *H01L 29/7787* (2013.01); H01L 21/02378 (2013.01); H01L 21/02433 (2013.01); H01L 29/2003 (2013.01); H01L 29/452 (2013.01); H01L 29/475 (2013.01); H01L 33/007 (2013.01); H01L 33/32 (2013.01)

(58) Field of Classification Search
CPC ............... H01L 29/2003; H01L 29/205; H01L 29/66462; H01L 29/7787; H01L 21/02433; H01L 33/007
USPC .......................................................... 257/76
See application file for complete search history.

(56) References Cited

U.S. PATENT DOCUMENTS

| | | | |
|---|---|---|---|
| 2009/0173951 | A1 | 7/2009 | Kikkawa et al. |
| 2010/0207136 | A1* | 8/2010 | Armitage ................ C30B 25/02 257/94 |
| 2010/0240198 | A1 | 9/2010 | Yokoyama |
| 2011/0073873 | A1 | 3/2011 | Kikkawa et al. |
| 2013/0248872 | A1 | 9/2013 | Nakamura et al. |
| 2014/0120703 | A1* | 5/2014 | Iwami ............... H01L 21/02381 438/478 |
| 2014/0239252 | A1* | 8/2014 | Hirayama ............ H01L 33/04 257/13 |
| 2014/0318443 | A1* | 10/2014 | Fenwick .......... H01L 21/02381 117/102 |
| 2015/0140792 | A1* | 5/2015 | Castaldi ............. H01L 21/0242 438/479 |
| 2017/0288046 | A1 | 10/2017 | Miyamoto et al. |

FOREIGN PATENT DOCUMENTS

| | | |
|---|---|---|
| JP | 2010-225710 | 10/2010 |
| JP | 2013-4681 | 1/2013 |
| JP | 2013-201398 | 10/2013 |
| WO | 2008-012877 | 1/2008 |

* cited by examiner

PROCESS OF FORMING EPITAXIAL SUBSTRATE AND SEMICONDUCTOR DEVICE PROVIDED ON THE SAME

CROSS REFERENCE TO RELATED APPLICATIONS

This application is closely related to a patent application Ser. No. 15/820,596 filed on Nov. 22, 2017 by an applicant same with the present application, which is hereby incorporated by reference. The present application claims the benefit of priority of Japanese Patent Application No. 2016-246993, filed on Dec. 20, 2016, which is incorporated herein by reference.

BACKGROUND OF INVENTION

1. Field of the Invention

The present invention relates to a process of forming an epitaxial substrate and a semiconductor device on the epitaxial substrate.

2. Related Prior Arts

An epitaxial substrate generally includes semiconductor layers epitaxially grown on a substrate by, for instance, the metal organic chemical vapor deposition (MOCVD) technique. Forming electrodes of a source, a drain, and a gate on thus prepared epitaxial substrate, a semiconductor device such as a field effect transistor (FET) may be obtained. A Japanese Patent Applications laid open No. JP2010-225710A and JP2013-004681A have disclosed a process of epitaxially growing an aluminum nitride (AlN) layer, an aluminum gallium nitride (AlGaN) layer, and a gallium nitride (GaN) layer sequentially on a substrate. Also, the latter prior patent document, JP2013-004681A, has reported that dissociation of nitrogen (N) from nitride semiconductor materials causes a drain leak current of an FET.

A process for forming an epitaxial substrate that includes an AlN layer on a substrate, where the AlN layer is sometimes called as a nucleus forming layer, and another nitride semiconductor layer grown on the nucleus forming layer occasionally differentiates growth conditions, especially a growth temperatures between the nucleus forming layer and the nitride semiconductor layer on the nucleus forming layer. Such a process changes the temperature condition after the growth of the nucleus forming layer as ceasing supplement of source gases. During the change of the temperature, the nucleus forming layer in a surface thereof is exposed within a condition of a high temperature, which accelerates the dissociation of nitrogen (N) from the surface of the nucleus forming layer and causes defects in an interface between the nucleus forming layer and the nitride semiconductor layer.

SUMMARY OF INVENTION

An aspect of the present invention relates to a process of forming a nitride semiconductor device. The process includes steps of sequentially growing a lower layer, an upper layer, and a nitride semiconductor layer on a substrate by the metal organic chemical vapor deposition (MOCVD) technique, where the lower layer and the upper layer, each made of aluminum nitride (AlN), operate as a nucleus forming layer. The step of growing the nitride semiconductor layer may be done under a temperature that is lower than a growth temperature of the upper layer. A feature of the process according to the present invention is that the step of growing the upper layer supplies a source gas for nitrogen (N), which may be ammonia ($NH_3$), with a flow rate that is greater than a flow rate of a source gas for nitrogen (N) in the lower layer.

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF EMBODIMENT

Figure 1:
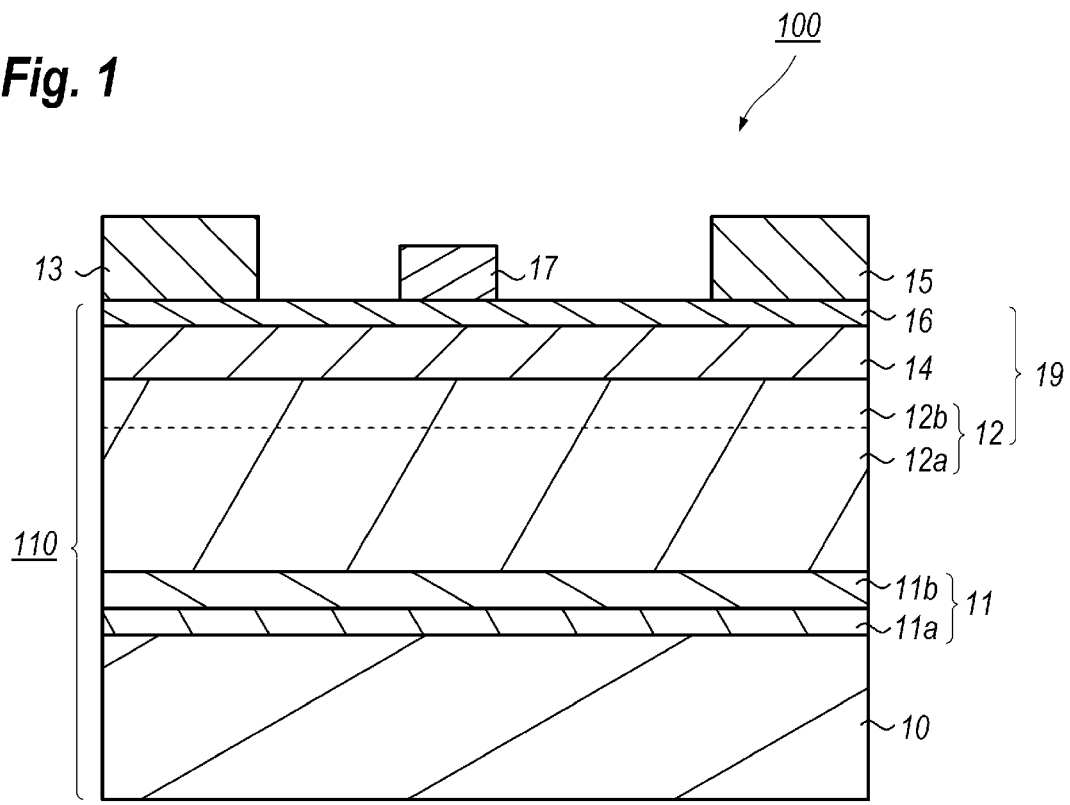
FIG. 1 shows a cross section of a semiconductor device according to the first embodiment of the present invention.

FIG. 1 shows a cross section of a semiconductor device 100 according to the first embodiment of the present invention. The semiconductor device 100 of the embodiment, which is a type of high electron-mobility transistor (HEMT), provides an epitaxial substrate 110, a source electrode 13, a drain electrode 15, and a gate electrode 17. The epitaxial substrate 110 includes a substrate 10, a nucleus forming layer 11, a channel layer 12 that is made of gallium nitride (GaN), a barrier layer 14, and a cap layer 16, where the channel layer 12, the barrier layer 14, and the cap layer 16 consists a semiconductor stack 19 of nitride semiconductor layers. The cap layer 16 forms the electrodes of the source 13, the drain 15, and the gate 17 thereon. A feature of the semiconductor device 100 of the first embodiment is that the nucleus forming layer 11 is divided into two layers, exactly the lower layer 11a and the upper layer 11b, and the upper layer 11b has a nitrogen composition that is higher than the nitrogen composition of the lower layer 11a.

Specifically, the lower layer 11a is provided on and in contact with the substrate 10, while, the upper layer 11b is provided on and in contact with the lower layer 11a. The GaN layer 12 is provided on the upper layer 11b, the barrier layer 14 is provided on the GaN layer 12, and the cap layer 16 is provided on the barrier layer 14. The electrodes of the source 13, the drain 15, and the gate 17 are provided on the cap layer 16.

The substrate 10 may be made of silicon carbide (SiC). The lower layer 11a is made of aluminum nitride (AlN) with a thickness of 10 nm, while, the upper layer 11b is also made of AlN but with a thickness thinner than that of the lower, which is 3 nm in the present embodiment. Although the lower layer 11a may have a stoichiometric composition, the upper layer 11b has a non-stoichiometric composition, exactly an N-rich composition.

The channel layer 12 may be made of un-doped gallium nitride (GaN) with a thickness of around 600 nm, where a lower portion of the GaN layer 12 may be operable as a buffer layer 12a, while, an upper portion thereof may be operable as a channel layer 12b. The barrier layer 14, which may be made of aluminum gallium nitride (AlGaN) with an aluminum composition of 0.22, has a thickness of 24 nm and forms or induces the channel in the channel layer 12b at the interface against the barrier layer 14. The cap layer 16, which may be made of n-type GaN, has a thickness of 5 nm.

The source electrode 13 and the drain electrode 15 may be formed from a stacked metal of tantalum (Ta), aluminum (Al), and tantalum (Ta), which may be denoted as Ta/Al/Ta, from a side of the cap layer 16; that is, the source electrode 13 and the drain electrode 15 may be formed by alloying the stacked metal above described. The gate electrode 17 may also provide a stacked metal of, from the side of the cap layer 16, nickel (Ni), palladium (Pd), gold (Au), and tantalum (Ta), which may be denoted as Ni/Pd/Au/Ta, where the nickel (Ni) makes a Schottky contact against the cap layer 16.

Table 1 below summarizes growth conditions of the epitaxial substrate 110 for the semiconductor device 100. In table 1, TMA, TMG, $NH_3$, $SiH_4$ mean tri-methyl-aluminum, tri-methyl-gallium, ammonia, and silane, respectively. Also in table 1, one (1) Torr is equal to 133.3 pascal (Pa), one (1) sccm (standard cc per minutes) is equal to $1.667 \times 10^{-8}$ m$^3$/s, and one (1) slm (standard liter per minutes) is equal to $1.667 \times 10^{-11}$ m$^3$/s, respectively.

TABLE 1

| layer | growth conditions | | | |
|---|---|---|---|---|
| | thickness (nm) | pressure (Torr) | temperature (° C.) | source flow rates |
| lower layer 11a | 10 | 100 | 1100 | TMA: 130 sccm $NH_3$: 15 slm |
| upper layer 11b | 3 | | | TMA: 130 sccm $NH_3$: 20 slm |
| GaN layer 12 | 600 | | 1060 | TMG: 54 sccm $NH_3$: 20 slm |
| barrier layer 14 | 24 | | | TMG: 30 sccm TMA: 90 sccm $NH_3$: 20 slm $SiH_4$: 8 sccm |
| cap layer 16 | 4 | | | TMG: 43 sccm $NH_3$: 20 slm $SiH_4$: 40 sccm |

The lower layer 11a and the upper layer 11b are grown at a growth temperature of 1100° C. and a growth pressure of 100 Torr, but the lower layer 11a is grown by supplying ammonia ($NH_3$) with a flow rate of 15 slm; while, the upper layer 11b is grown with a flow rate of $NH_3$ of 20 slm that is increased by 5 slm from that in the lower layer 11a.

Figure 2A:
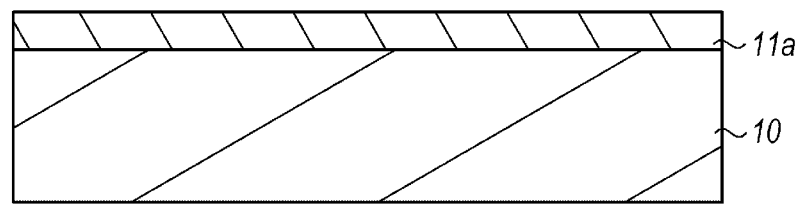
FIGS. 2A to 2C show cross sections of a semiconductor epitaxial substrate directed to the semiconductor device shown in FIG. 1, where the cross sections corresponds to respective processes of forming the epitaxial substrate.
Figure 2B:
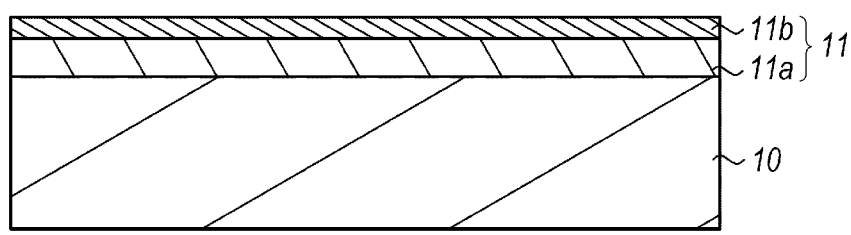
Figure 2C:
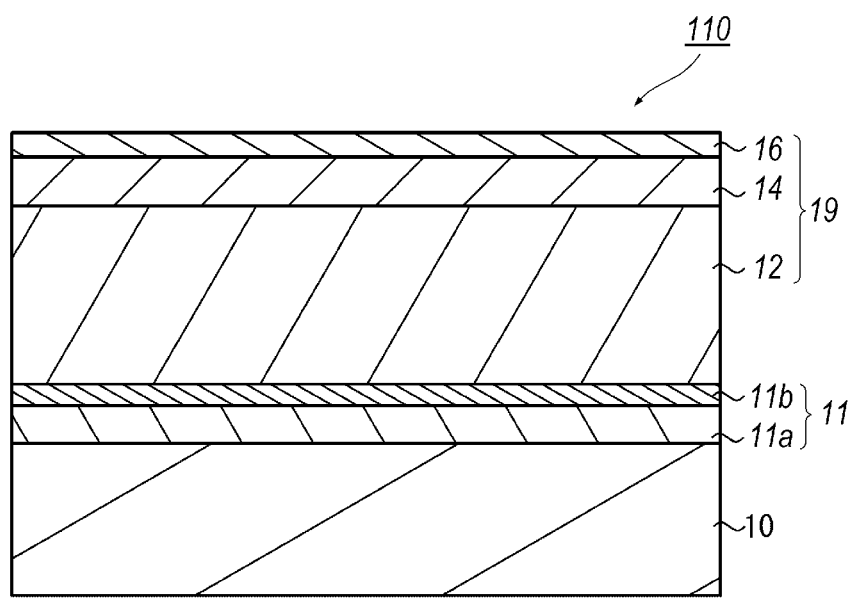
Figure 3A:
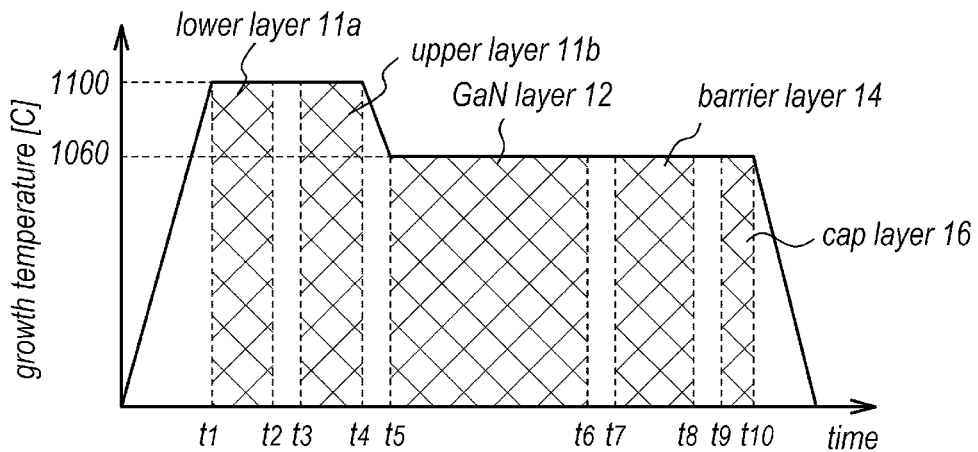
FIG. 3A shows a sequence of forming the epitaxial substrate by the metal organic chemical vapor deposition (MOCVD) technique.
Figure 3B:
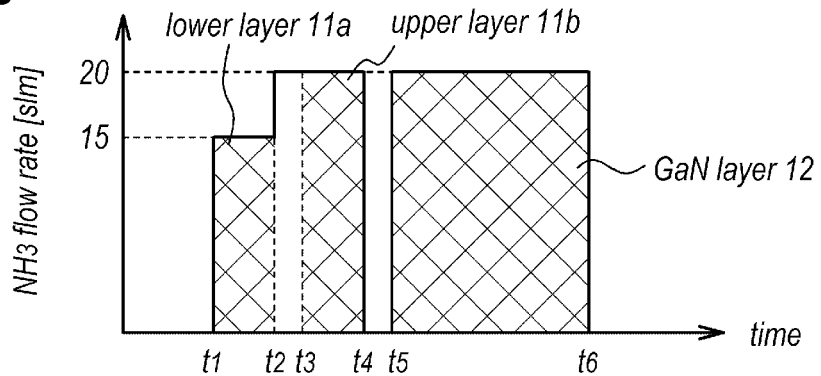
FIG. 3B shows flow rates of ammonia ($NH_3$) during the growth of a lower layer and an upper layer of a nucleus forming layer in the first embodiment, and FIG. 3C also shows flow rates of ammonia ($NH_3$) in a process modified from the process shown in FIG. 3B.

FIGS. 2A to 2C show cross sections of the epitaxial substrate 110 at respective steps of the process of growing the epitaxial substrate 110. FIG. 3A shows a sequence of growth temperatures for the epitaxial substrate 110, FIG. 3B shows flow rates of ammonia ($NH_3$) during the growth of the lower layer 11a, the upper 11b and the GaN layer 12. In FIGS. 3A and 3B, hatched areas show periods where the respective layers are grown, while, non-hatched areas correspond to periods where the growths are interrupted.

The process first sets the temperature of the substrate 10 to be 1100° C. Supplying ammonia ($NH_3$) with the flow rate of 15 slm and TMA 10 with the flow rate of 130 sccm, the lower layer 11a made of AlN is grown on the substrate 10 during the period from $t_1$ to $t_2$ by a thickness of 10 nm. Then, interrupting the supplement of TMA, the process increases the flow rate of ammonia ($NH_3$) from 15 to 20 slm but continuously flowing nitrogen (N), which operates as a carrier gas, as keeping the temperature of the substrate 10 to be 1100° C. during the period from $t_2$ to $t_3$. At the instant $t_3$ where the flow of ammonia ($NH_3$) becomes stable, the growth of the upper layer 11b begins by supplying TMA with the flow rate of 130 sccm until the upper layer 11b has a thickness of 3 nm. Thus, the process decreases a ratio of the flow rates of a source gas for the group III element, namely aluminum (Al), against the flow rate of the source gas for the group V element, namely nitrogen (N), where the ratio of the flow rates of the source gases is often denoted as a III/V ratio.

Thereafter, the process lowers the temperature of the substrate 10 down to 1060° C. during a period from t4 to t5, as shown in FIG. 3A. During that period, the supplement of ammonia ($NH_3$) is interrupted but nitrogen (N) as the carrier gas is continuously supplied as shown in FIG. 3B. Setting the flow rate of ammonia ($NH_3$) to be 20 slm, and supplying the gas sources for the group III element as shown in Table 1 above, the GaN layer 12 may be grown on the upper layer 11b. The process further grows the AlGaN barrier layer 14 on the GaN layer during the period t7 to t8 in FIG. 3A, and the GaN cap layer 16 on the AlGaN barrier layer 14 during the period t9 to t10. The process continuously supplies nitrogen (N) as a carrier gas during the growth of the semiconductor stack 19 including the GaN layer 12, the AlGaN barrier layer 14, and the GaN cap layer 16. Thus, the epitaxial substrate 110 may be formed. Forming the electrodes of the source 13, the drain 15, and the gate 17 on the cap layer 16, the semiconductor device 100 shown in FIG. 1 may be obtained. The semiconductor device 100 thus formed may further provide a passivation film made of, for instance, silicon nitride (SiN) to protect the epitaxial substrate 110 and the electrodes, 13 to 17, on a top of the epitaxial substrate 110. In a modification, the semiconductor device 100 may omit the cap layer 16 and provide the passivation film described above on the barrier layer 14, where the electrodes, 13 to 17, may be directly provided on the barrier layer 14.

The first embodiment of the process of forming the semiconductor device 100 thus described increases the supplement, or the flow rate of ammonia ($NH_3$) as the source gas for nitrogen (N) during the growth of the upper layer 11b, which means that the nitrogen composition in the upper layer 11b becomes larger compared with that of the lower layer 11a, which is sometimes called as an N-rich composition. Because the growth temperature for the GaN layer 12 is lower than that for the upper layer 11b, the process is necessary to lower the temperature of the substrate 10 after the growth of the upper layer 11b but before the growth of the GaN layer 12, during which the substrate 10, exactly, the surface of the upper layer 11b is exposed to a high temperature atmosphere and the upper layer 11b possibly dissociates nitrogen (N) from the surface thereof. The N-rich composition of the upper layer 11b may effectively compensate the dissociation of nitrogen (N) and suppress defects caused by the dissociation of nitrogen (N), which may also suppress defects induced in the layers grown on the upper layer 11b. Thus, the drain leak current caused by the defects may be effectively reduced.

A process may increase the supplement of ammonia ($NH_3$) during not only the growth of the upper layer 11b but the growth of the lower 11a to increase the nitrogen composition. However, when the nucleus forming layer 11 has an N-rich composition in a whole thereof, the growth for the semiconductor stack 19 on the AlN nucleus forming layer 11 varies the growth mode thereof and degrades crystal quality thereof. Thus, the process may divide the growth of the nucleus forming layer 11 into the lower layer 11a on the substrate 10 and the upper layer 11b on the lower layer 11a, where the lower layer 11a has a substantially stoichiometric composition between aluminum (Al) and nitrogen (N), while the upper layer 11b has the N-rich composition by increasing the supplement, or the flow rate of ammonia ($NH_3$).

The nucleus forming layer 11 is preferably grown under relatively higher temperature to decrease pits appearing on a grown surface thereof. Accordingly, the growth temperature for the nucleus forming layer 11 is preferably higher than 1100° C. While, the GaN layer 12 is preferably grown under a relatively lower temperature to suppress the dissociation of nitrogen (N) from the surface thereof. Accordingly, the growth temperature for the GaN layer 12 is preferably lower than that for the nucleus forming layer 11, typically around 1060° C. However, those conditions for the nucleus forming layer 11 and the GaN layer 12 are optional. For instance, the growth temperature for the GaN layer 12 is preferably lower than that for the nucleus forming layer 11 by at least 30° C. The difference in the growth temperatures may be 40° C. or greater in the present embodiment. The difference in the growth temperature inevitably accompanies with a lowering of a temperature after the growth of the upper layer 11b. As the difference in the growth temperatures becomes larger, a period to lower the temperature and stabilize thereat becomes longer, which means that a period for the upper layer 11b to be exposed in a high temperature becomes longer and nitrogen (N) is possibly dissociated from the surface of the upper layer 11b. The embodiment of the present embodiment, because of the N-rich composition of the upper layer 11b, may effectively suppress the defects caused in the surface of the upper layer 11b.

The supplement, or the flow rate of ammonia ($NH_3$) during the growth of the upper layer 11b is preferably greater than 20 slm, which may form the N-rich composition in the upper layer 11b and suppress the defects due to the dissociation of nitrogen (N) from forming in the upper layer 11b. The process may increase the supplement, or the flow rate of ammonia ($NH_3$) as a difference in the growth temperatures between the upper layer 11b and the GaN layer 12 becomes larger in order to enhance the nitrogen composition in the upper layer 11b. Preferably, the flow rate of ammonia ($NH_3$) for the upper layer 11b is greater than that for the lower layer 11a by at least 5 slm.

In order to enhance the quality of the semiconductor stack 19 grown on the nucleus forming layer 11, the semiconductor stack 19 preferably decreases lattice miss-matchings against the substrate 10. Accordingly, the present embodiment provides the lower layer 11a whose lattice constant is closest to that of the substrate 10 and has a substantial thickness, which may be thicker than, for instance, 5 nm or a thickness greater than 10 nm is further preferable. The semiconductor stack 19 should be grown on a semiconductor surface with lesser pits that could accelerate the dissociation of nitrogen (N). Accordingly, the upper layer 11b preferably has a thickness greater than 3 nm. The lower layer 11a may have a greater thickness than that of the upper layer 11b.

The process of the present embodiment, as shown in FIG. 3B, continuously supplies ammonia ($NH_3$) during the period from t2 to t3, namely after the completion of the growth of the lower layer 11a but before the beginning of the growth of the upper layer 11b. The growth temperatures for the lower layer 11a and the upper layer 11b are preferably invariant, because the process once interrupts the supplement of TMA after the growth of the lower layer 11a, increases the supplement or the flow rate of ammonia ($NH_3$), and resumes the supplement of TMA again after the flow rate of ammonia ($NH_3$) stabilizes. Accordingly, the surface of the lower layer 11a is temporarily exposed in a high temperature during the period from t2 to t3. A condition where the growth temperatures for the lower layer 11a and the upper layer 11b are invariant may shorten the period from t2 to t3, which may resultantly suppress the dissociation of nitrogen (N) from the lower layer 11a.

Figure 3C:
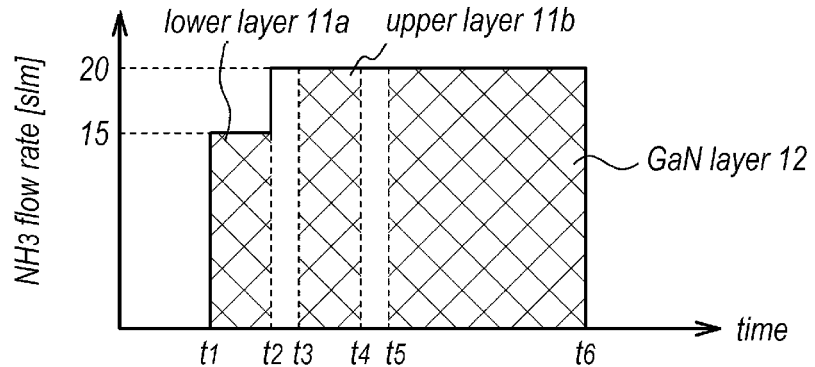

FIG. 3C shows another sequence for supplying ammonia ($NH_3$) that is modified from the sequence shown in FIG. 3B. That is, the sequence shown in FIG. 3C continues the supplement of ammonia ($NH_3$) in addition to the supplement of nitrogen ($N_2$) as a carrier gas during the period after the growth of the upper layer 11b but before the growth of the GaN layer 12. The first embodiment described above interrupts the supplement of ammonia ($NH_3$) in addition to the TMA after the growth of the upper layer 11b. Modified from the embodiment described above, the sequence shown in FIG. 3C continues the supplement of ammonia ($NH_3$) and only the TMA is interrupted after the growth of the upper layer 11b. This sequence may further suppress the dissociation of nitrogen (N) from the surface of the upper layer 11b because, in addition to the upper layer 11b with an N-rich composition, the atmosphere contains ammonia ($NH_3$).

Second Embodiment

A growth sequence according to the second embodiment of the invention decreases the supplement of TMA, which is a source gas for aluminum (Al), during the growth of the upper layer 11b. Table 2 summarizes the growth conditions for the epitaxial substrate 110A according to the second embodiment of the invention.

TABLE 2

| | | growth conditions | | |
|---|---|---|---|---|
| layer | thickness (nm) | pressure (Torr) | temperature (° C.) | source flow rates |
| 1$^{st}$ layer 11a | 10 | 100 | 1100 | TMA: 130 sccm $NH_3$: 15 slm |
| 2$^{nd}$ layer 11b | 3 | | | TMA: 80 sccm $NH_3$: 20 slm |
| GaN layer 12 | 600 | | 1060 | TMG: 54 sccm $NH_3$: 20 slm |
| barrier layer 14 | 24 | | | TMG: 30 sccm TMA: 90 sccm $NH_3$: 20 slm $SiH_4$: 8 sccm |
| cap layer 16 | 5 | | | TMG: 43 sccm $NH_3$: 20 slm $SiH_4$: 40 sccm |

As clearly listed in Table 2 above, the lower layer 11a and the upper layer 11b are grown under a temperature and a pressure common to those two layers, 11a and 11b. The lower layer 11a is grown by supplying ammonia ($NH_3$) with a flow rate of 15 slm, while, the upper layer 11b is grown with a flow rate of 20 slm increased by 5 slm from that for the lower layer 11a. A feature of the second embodiment is that the flow rate of TMA for the upper layer 11b is decreased from the flow rate of TMA for the lower layer 11a by 50 sccm, where the former is 80 sccm while the latter is 130 sccm.

Figure 4A:
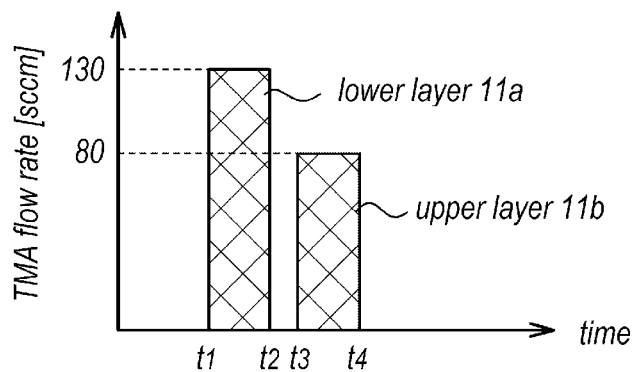
FIG. 4A shows flow rates of tri-methyl-aluminum (TAM) during the growth of the lower layer and the upper layer of the nucleus forming layer according to the second embodiment, FIG. 4B also shows a flow rate of TMA in the process modified from that shown in FIG. 4A.

FIG. 4A shows flow rates of TMA according to the second embodiment of the present invention. In FIG. 4A, the horizontal axis shows the period, while, the vertical axis corresponds to the flow rate of TMA. During the growth of the lower layer 11a from the period t1 to t2, the flow rate of TMA is set to be 130 sccm as shown in FIG. 4A and listed in table 2. The growth of the upper layer 11b from the period t3 to t4 is done by setting the flow rate of TMA to be 80 sccm that is decreased by 50 sccm from the flow rate for the lower layer 11a. Besides, the flow rate of ammonia ($NH_3$) during the growth of the lower layer 11a from the period t1 to t2 is set to be 15 slm as shown in FIG. 3B, while, that for the upper layer 11b during the period from t3 to t4 is increased by 5 slm therefrom, that is, the flow rate becomes 20 slm also shown in FIG. 3B and listed in table 2.

The second embodiment of the present invention may grow the upper layer 11b with the N-rich composition, which may reduce the drain leak current. Besides, the flow rate of TMA during the growth of the upper layer 11b is decreased from that during the growth of the lower layer 11a, which may reduce the growth rate of the upper layer 11b compared with the growth rate of the lower layer 11a. Accordingly, the process may precisely control a thickness of the upper layer 11a. For instance, an upper layer 11b having a limited thickness of 3 nm may be grown uniformly and precisely.

Figure 4B:
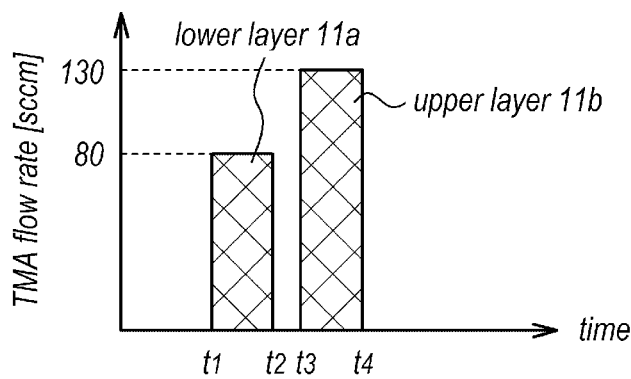
FIG. 4C shows a flow rate of ammonia ($NH_3$) in the process according to the third embodiment of the present invention.

Modification of the second embodiment is shown in FIG. 4B that shows the flow rate of TMA for the nucleus forming layer 11. When the lower layer 11a is thinner than the upper layer 11b, as shown in FIG. 4B, the lower layer 11b may be grown by supplying TMA with a flow rate smaller than that for the upper layer 11b, for instance, setting the flow rate to be 80 sccm, which reduces the growth rate of the lower layer 11a. That is, the flow rate of TMA may be decreased during the growth of one of the lower layer 11a and the upper layer 11b with a thickness smaller than that of the other of the lower layer 11a and the upper layer 11b. Then, the thickness of the layer grown under a smaller flow rate of TMA may be precisely controlled in a thickness thereof.

Third Embodiment

Figure 4C:
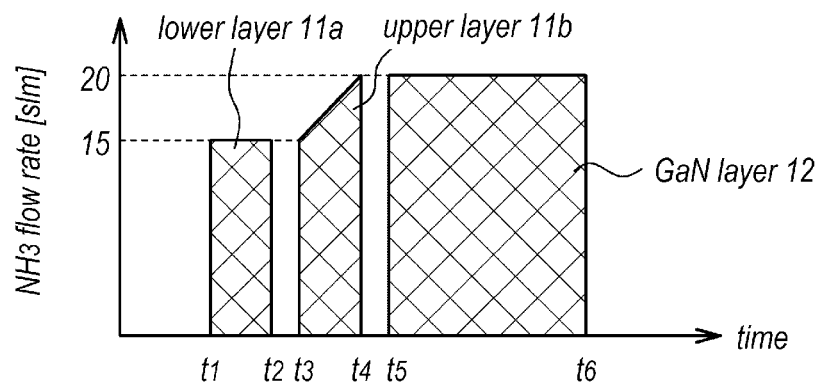

The third embodiment of the present invention gradually increases the flow rate of ammonia. FIG. 4C shows the flow rate of ammonia ($NH_3$) during the growths of the lower layer 11a and the upper layer 11b. The third embodiment of the present invention, as shown in FIG. 4C, gradually increases the flow rate of ammonia ($NH_3$) from the beginning of the growth thereof to the completion thereof, that is the flow rate of ammonia ($NH_3$) at the beginning is set to be 15 slm, while that at the completion of the growth is set to be 20 slm. Moreover, the flow rate of ammonia ($NH_3$) gradually and monotonically increases from the beginning of the growth to the completion thereof. According to the sequence shown in FIG. 4C, the upper layer 11b may have the N-rich composition. Thus, the sequence shown in FIG. 4C may reduce the defects induced during the growth of the GaN layer 12 and the drain leak current. Continuous and monotonic increase of the flow rate of ammonia ($NH_3$) may form a transition layer in an interface between the lower layer 11a and the upper layer 11b, which may reduce the defects induced within the upper layer 11b.

In the embodiment thus described, source materials and flow rates thereof are not restricted to those exemplarily described above. For instance, the flow rate of ammonia ($NH_3$) may be greater than 20 slm or smaller than 15 slm. Further specifically, the lower layer 11a may be grown by supplying ammonia ($NH_3$) with the flow rate thereof smaller than 15 slm, while, the upper layer 11b may be grown by supplying ammonia ($NH_3$) with a flow rate greater than 20 slm. A key feature of the embodiment is that the flow rate of ammonia ($NH_3$) for the upper layer 11b is greater than that for the lower layer 11a. Thus, the upper layer 11b may be grown as the N-rich composition, which may suppress the dissociation of nitrogen from the period t4 to t5, after the completion of the growth of the upper layer 11b but before the beginning of the growth of the GaN layer 12, during which the surface of the upper layer 11b is exposed to an ambient of a high temperature. The source material for nitrogen (N) is not restricted to ammonia ($NH_3$), and that for aluminum (Al) is also not restricted to TMA. For instance, tri-ethyl-aluminum (TEA) may be applicable to a source material for aluminum (Al).

The semiconductor device 100 thus formed may further provide an insulating film on the electrodes of the source 13, the drain 15, and the gate 17, and on the cap layer 16 between the electrodes, 13 to 17, to enhance moisture resistance of the semiconductor device 100, where such an insulating film is sometimes called as a passivation film. The insulating film may be made of silicon nitride (SiN), silicon oxy-nitride (SiON), and so on.

Also, the semiconductor substrate 10 of the embodiment may provide other devices except for the FET or an active device, that is, the substrate may provide or integrate passive devices. The substrate 10 may provide other electrodes except for the source 13, the drain 15, and the gate 17, namely, those for passive devices and so on.

The semiconductor stack 19 includes nitride semiconductors, such as, except for GaN and AlGaN, indium gallium nitride (InGaN), indium nitride (InN), indium aluminum nitride (InAlN), indium aluminum gallium nitride (InAlGaN), and so on. The substrate 10 may be, except for SiC, made of silicon (Si), sapphire ($Al_2O_3$), gallium nitride (GaN), and so on.

Although the present invention has been described with reference to specific embodiments, ordinary person skilled in the art will recognize that changes may be made in form and detail without departing from the spirit and scope of the invention.

What is claimed is:

1. A process of forming an epitaxial substrate including a substrate, the process comprising steps of:
    growing a lower layer made of aluminum nitride (AlN) with aluminum (Al) as a group III element and nitrogen (N) as a group V element on the substrate by a metal organic chemical vapor deposition (MOCVD) technique at a source gas flow rate for the group III element and a source gas flow rate for the group V element in a first III/V ratio;
    growing an upper layer made of AlN by the MOCVD technique at a source gas flow rate for the group III element and a source gas flow rate for the group V element in a second III/V ratio; and
    growing a nitride semiconductor layer on the upper layer under a growth temperature lower than a growth temperature for the upper layer,
    wherein the lower layer and the upper layer provide an AlN nucleus forming layer, the upper layer having a thickness that is 5 nm at most and that is smaller than a thickness of the lower layer on the substrate,
    wherein the second III/V ratio is smaller than the first III/V ratio, and
    wherein ammonia ($NH_3$) continuously is supplied after completion of growing of the lower layer and before beginning growing of the upper layer.

2. The process according to claim 1,
wherein the growth temperature for the nitride semiconductor layer is at least 30° C. lower than the growth temperature for the upper layer.

3. The process according to claim 1,
further including a step of, after the step of growing the upper layer but before the step of growing the nitride semiconductor layer, supplying a source material for nitrogen (N) within an apparatus for the MOCVD technique.

4. The process according to claim 1,
wherein, in the step of growing the upper layer, the flow rate of the source material for Al is decreased in comparison with the flow rate of the source material for Al in the lower layer.

5. The process according to claim 1,
wherein the step of growing the lower layer grows the lower layer with a thickness at least 5 nm.

6. The process according to claim 1,
wherein the step of growing the nitride semiconductor layer grows a layer made of gallium nitride (GaN) under the growth temperature lower than the growth temperature of the upper layer.

7. The process according to claim 1,
wherein, in the step of growing the upper layer, the flow rate of the source material for nitrogen (N) is at least 5 standard liters per minutes (slm) and higher than the flow rate of the source material for nitrogen (N) during growth of the lower layer.

8. The process according to claim 1,
wherein the upper layer has a nitrogen rich composition.

* * * * *